United States Patent
Yao et al.

(10) Patent No.: US 9,589,890 B2
(45) Date of Patent: Mar. 7, 2017

(54) METHOD FOR INTERCONNECT SCHEME

(71) Applicant: Taiwan Semiconductor Manufacturing Company, Ltd., Hsin-Chu (TW)

(72) Inventors: Hsin-Chieh Yao, Hsinchu (TW); Carlos H. Diaz, Mountain View, CA (US); Cheng-Hsiung Tsai, Miaoli County (TW); Chung-Ju Lee, Hsinchu (TW); Chien-Hua Huang, Miaoli County (TW); Hsi-Wen Tien, Hsinchu County (TW); Shau-Lin Shue, Hsincu (TW); Tien-I Bao, Taoyuan County (TW); Yung-Hsu Wu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/803,671

(22) Filed: Jul. 20, 2015

(65) Prior Publication Data

US 2017/0025346 A1    Jan. 26, 2017

(51) Int. Cl.
| | |
|---|---|
| *H01L 23/528* | (2006.01) |
| *H01L 21/768* | (2006.01) |
| *H01L 23/522* | (2006.01) |
| *H01L 23/532* | (2006.01) |
| *H01L 21/3213* | (2006.01) |

(52) U.S. Cl.
CPC ...... *H01L 23/528* (2013.01); *H01L 21/32136* (2013.01); *H01L 21/32139* (2013.01); *H01L 21/7682* (2013.01); *H01L 21/76802* (2013.01); *H01L 21/76831* (2013.01); *H01L 21/76835* (2013.01); *H01L 21/76877* (2013.01); *H01L 23/5226* (2013.01); *H01L 23/53228* (2013.01); *H01L 23/53233* (2013.01); *H01L 23/53295* (2013.01)

(58) Field of Classification Search
CPC ............... H01L 23/528; H01L 23/5226; H01L 23/53228; H01L 23/53233; H01L 23/53295; H01L 21/32136; H01L 21/76802; H01L 21/7682; H01L 21/76831; H01L 21/76835; H01L 21/76877
USPC ........................................................ 257/773
See application file for complete search history.

(56) References Cited

U.S. PATENT DOCUMENTS

| | | | |
|---|---|---|---|
| 6,518,670 B1 * | 2/2003 | Mandelman | ...... H01L 21/76897 257/750 |
| 8,039,179 B2 | 10/2011 | Shieh et al. | |
| 8,202,681 B2 | 6/2012 | Lin et al. | |
| 8,728,332 B2 | 5/2014 | Lin et al. | |
| 8,822,243 B2 | 9/2014 | Yan et al. | |
| 2006/0091468 A1 | 5/2006 | Liaw | |
| 2011/0281208 A1 | 11/2011 | Lin et al. | |

(Continued)

*Primary Examiner* — Yasser A Abdelaziez
(74) *Attorney, Agent, or Firm* — Haynes and Boone, LLP

(57) ABSTRACT

A method of fabricating a semiconductor device is disclosed. The method includes forming a first dielectric layer over a substrate, forming a first trench in the first dielectric layer, forming a metal line in the first trench, removing a first portion of the metal line to form a second trench and removing a second portion of the metal line to form a third trench. A third portion of the metal line is disposed between the second and third trenches. The method also includes forming a second dielectric layer in the second and third trenches.

20 Claims, 10 Drawing Sheets

(56) References Cited

U.S. PATENT DOCUMENTS

| | | | |
|---|---|---|---|
| 2012/0013014 A1* | 1/2012 | Jang | H01L 21/76808 257/773 |
| 2012/0278776 A1 | 11/2012 | Lei et al. | |
| 2013/0069234 A1* | 3/2013 | Lee | H01L 23/53238 257/751 |
| 2013/0295769 A1 | 11/2013 | Lin et al. | |
| 2013/0320451 A1 | 12/2013 | Liu et al. | |
| 2014/0027908 A1* | 1/2014 | Tsai | H01L 21/76885 257/751 |
| 2014/0131883 A1* | 5/2014 | Huang | H01L 21/7682 257/774 |
| 2014/0151888 A1* | 6/2014 | Tsai | H01L 23/5222 257/762 |
| 2014/0193974 A1 | 7/2014 | Lee et al. | |
| 2014/0197538 A1* | 7/2014 | Lu | H01L 21/7682 257/751 |
| 2014/0215421 A1 | 7/2014 | Chen et al. | |
| 2014/0242794 A1 | 8/2014 | Lin et al. | |
| 2014/0264760 A1 | 9/2014 | Chang et al. | |
| 2014/0264899 A1 | 9/2014 | Chang et al. | |
| 2014/0273442 A1 | 9/2014 | Liu et al. | |
| 2014/0273446 A1 | 9/2014 | Huang et al. | |

* cited by examiner

METHOD FOR INTERCONNECT SCHEME

BACKGROUND

The semiconductor integrated circuit (IC) industry has experienced rapid growth. Technological advances in IC design and materials have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. When a semiconductor device such as a metal-oxide-semiconductor field-effect transistor (MOSFET) is scaled down through various technology nodes, interconnects of conductive lines and associated dielectric materials that facilitate wiring between the transistors and other devices play a more important role in IC performance improvement. Although existing methods of fabricating IC devices have been generally adequate for their intended purposes, they have not been entirely satisfactory in all respects. For example, challenges rise in forming a metal line with a short length, or referred to as metal island.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
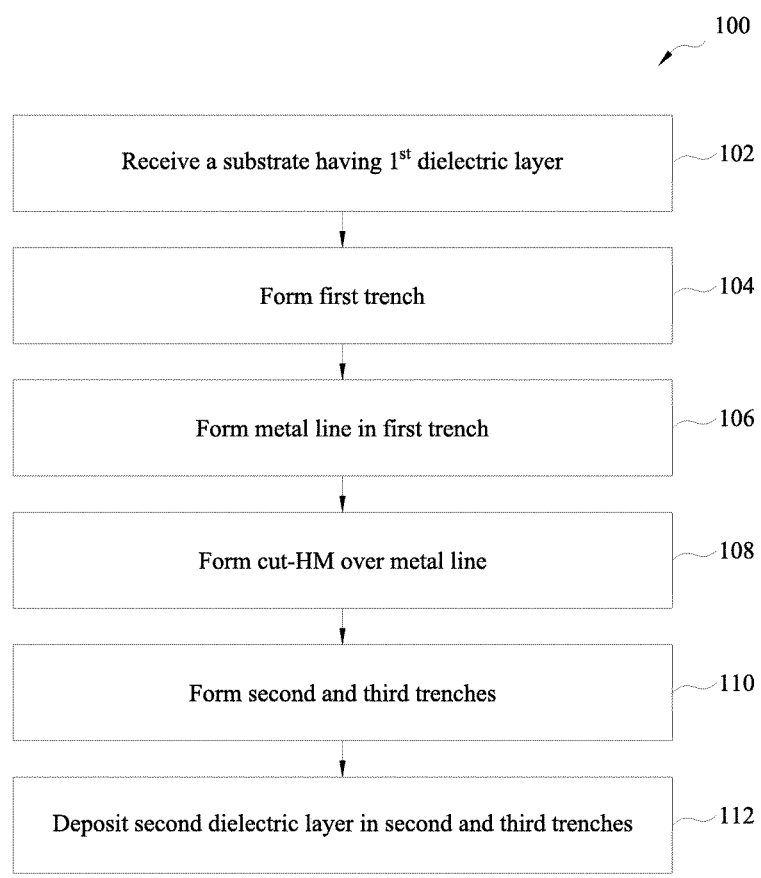
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor device in accordance with some embodiments. The method 100 is discussed in detail below, with reference to a semiconductor device 200, shown in FIGS. 2A-2B, 3A-3B, 4A-4D, 5A-5B, 6A-6D and 7A-7C.

FIG. 1 is a flowchart of one embodiment of a method 100 of fabricating one or more semiconductor devices according to aspects of the present disclosure. The method 100 is discussed in detail below, with reference to a semiconductor device 200 shown in FIGS. 2A to 7B for the sake of example.

Figure 2A:
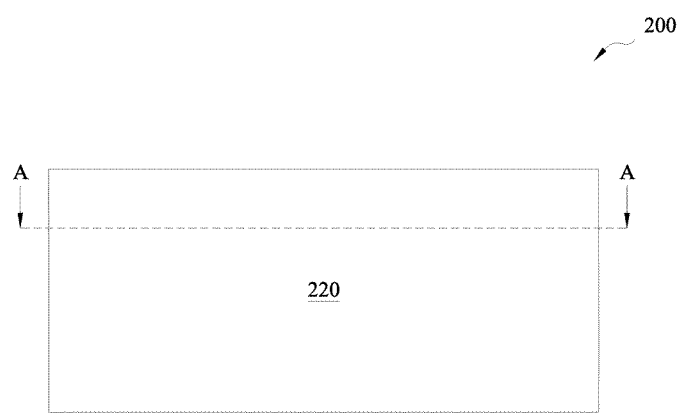
FIGS. 2A, 3A, 4A, 4C, 5A, 6A, 6C and 7A are top views of an example semiconductor device in accordance with some embodiments.
Figure 2B:
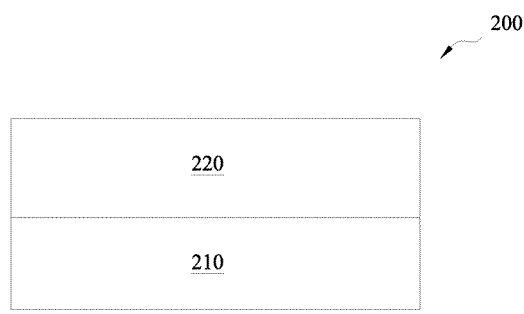
FIG. 2B is a cross-sectional view of an example semiconductor device in accordance with some embodiments, along the line A-A in FIG. 2A.

Referring to FIGS. 1 and 2A-2B, the method 100 starts at step 102 by providing a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary semiconductor device 200, the insulator layer is a component (e.g., layer) of a silicon-on-insulator substrate.

The substrate 210 may also include various doped regions. The doped regions may be doped with p-type dopants, such as boron or $BF_2$; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The substrate 210 may also include source/drain (S/D) features, beside and separated by the gate stacks. The S/D features may include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), and/or other suitable materials. The S/D feature may be formed by epitaxial growing processes, such as CVD, VPE and/or UHV-CVD, molecular beam epitaxy, and/or other suitable processes.

The substrate 210 may also include conductive features. The conductive features may include electrodes, capacitors, resistors or a portion of a resistor. The conductive feature may also include a portion of the interconnect structure, which includes a multi-layer interconnect (MLI) structure and an interlevel dielectric (ILD) layer integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers. The conductive features may be formed by a procedure including lithography, etching and deposition.

In the present embodiment, the substrate 210 includes a first dielectric layer 220. The first dielectric layer 220 may include silicon oxide, a dielectric material having a dielectric constant (k) lower than thermal silicon oxide (therefore referred to as low-k dielectric material layer), such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The first dielectric layer 220 may include a single layer or multiple layers. The first dielectric layer 220 may be deposited by CVD, ALD or spin-on coating.

Multilayer interconnects are typically formed over the substrate 210 to connect various devices (transistors, resistors, capacitors, etc.) to form an integrated circuit. In a typical interconnect structure, metal lines (e.g., copper wires) are laid in first dielectric layer 220 and are connected through vias from one layer to another layer. Copper wires and vias are typically fabricated using single or dual damascene processes. In such processes, the first dielectric layer 220 is patterned to form trenches, then the trenches are overfilled with copper, and chemical-mechanical planarization (CMP) is used to remove excessive copper, thereby forming copper wires in the trenches. Subsequently, another dielectric layer is formed over the underlying dielectric layer and the above process is repeated to form vias and upper level copper wires.

It is often that metal lines with various lengths are needed. Especially, when device scale down. Typically, metal lines are formed by forming trenches with various lengths first and then filling those trenches with a metal layer. However, when the trench dimensions get smaller, the gap-filling ability of metallic materials is limited and the gap-filling quality and reliability are challenged. This results in voids formed in a metal line, which may lead to a high resistance issue and a device reliability issue. Challenges also rise to minimize process-induced-damage on dielectric layers during formation of metal lines. In the present embodiment, the method 100 provides forming metal lines (or islands) while avoiding many of the challenges of filling a metal layer in a small trench.

Figure 3A:
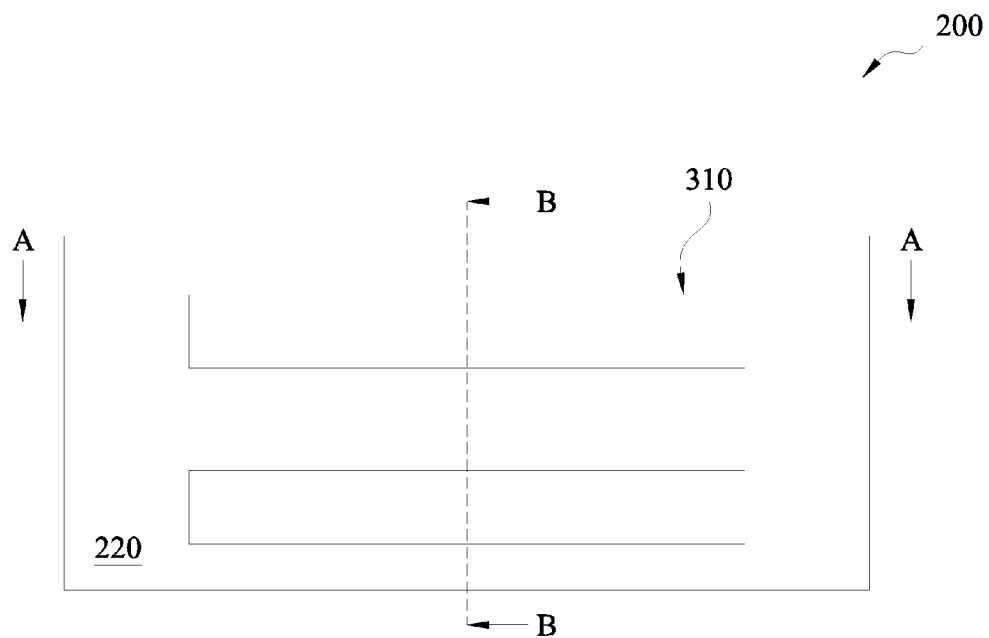
Figure 3B:
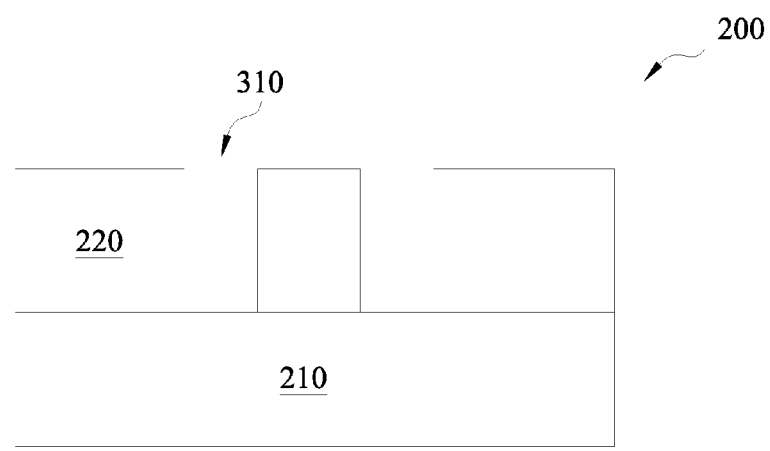
FIG. 3B is a cross-sectional view of an example semiconductor device in accordance with some embodiments, along the line B-B in FIG. 3A.

Referring to FIGS. 1 and 3A-3B, method of 100 proceeds to step 104 by forming first trenches 310 in the first dielectric layer 220. The first trenches 310 extend along the line A-A direction in FIG. 3A. In some embodiments, the first trenches 310 are formed by forming a patterned photoresist layer over the first dielectric layer 220 and then etching the first dielectric layer 220 through the patterned photoresist layer. An exemplary lithography process may include forming a resist layer, exposing the resist layer by a lithography exposure process, performing a post-exposure bake process, and developing the resist layer to form the patterned resist layer. In another embodiment, the first trenches 310 are formed by depositing a HM layer over the second dielectric layer 220, depositing a photoresist layer over the HM layer, patterning the photoresist layer, then etching the HM layer through patterned photoresist layer to pattern and then etching the dielectric layer 220 through the patterned HM layer.

The etching process may include a selective wet etch, a selective dry etch, and/or a combination thereof. As an example, the etching process includes a plasma dry etching process using a fluorine-based chemistry, such as $CF_4$, $SF_6$, $CH_2F_2$, $CHF_3$, and/or $C_2F_6$. The respective etching process may be tuned with various etching parameters, such as etchant used, etching temperature, etching solution concentration, etching pressure, etchant flow rate, and/or other suitable parameters.

After forming the first trenches 310, the patterned HM is removed by a proper etch process. In one example where the patterned HM is a photoresist pattern, the patterned HM is removed thereafter by wet stripping and/or plasma ashing.

Figure 4A:
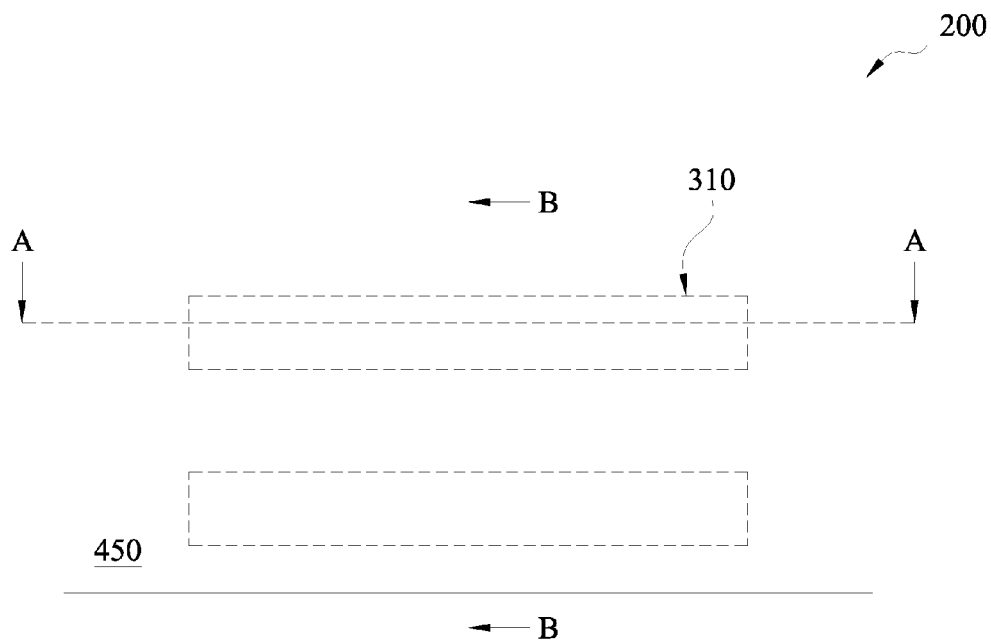
Figure 4B:
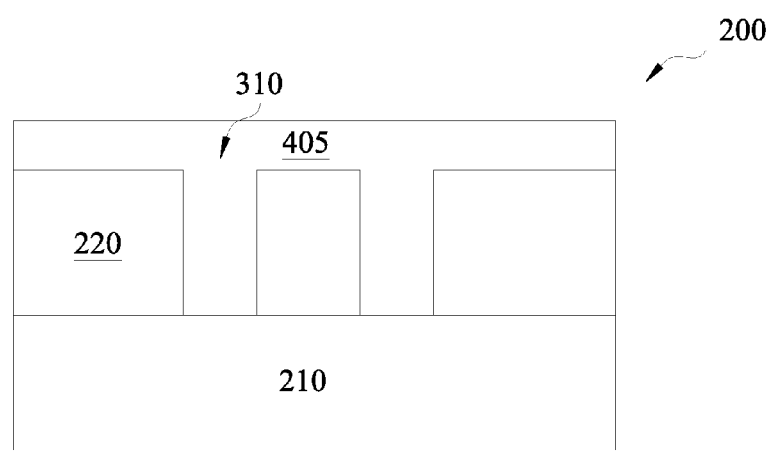
FIG. 4B is a cross-sectional view of an example semiconductor device in accordance with some embodiments, along the line B-B in FIG. 4A.

Referring to FIGS. 1 and 4A-4B, the method 100 proceeds to step 106 by forming metal layer 405 in the first trenches 310. In the present embodiment, a metal layer 405 is deposited in the first trench 310. The metal layer 405 may include copper (Cu), tin (Sn), silver (Ag), gold (Au), palladium (Pd), platinum (Pt), rhenium (Re), iridium (Ir), ruthenium (Ru), osmium (Os), copper manganese (CuMn), copper aluminum (CuAl), copper titanium, (CuTi), copper vanadium (CuV), copper chromium (CuCr), copper silicon (CuSi), copper niobium (CuNb), or other suitable metals. The metal layer 405 may be deposited by PVD, CVD, ALD, electrochemical plating (ECP), or other suitable processes. In one embodiment, the metal layer 405 includes a copper layer deposited by PVD. In one embodiment, the metal layer 405 includes a copper seed layer deposited by PVD and bulk copper layer by plating. In various other examples, copper deposition may be implemented by other techniques, such as CVD or MOCVD. A Cu reflow process may be added to enhance Cu filling profile.

In some embodiments, an electrically metal-diffusion barrier layer (not shown) is deposited in the first trench 310 first and the metal layer 405 is deposited over the barrier layer. The barrier layer may include tantalum (Ta) or tantalum nitride (TaN) and the metal conductor may be copper (Cu), aluminum (Al), tungsten (W), cobalt (Co), or other suitable metals. In embodiments, the barrier layer includes one or more layers of material. The barrier layer be deposited by PVD, MOCVD), or other suitable technique.

Figure 4C:
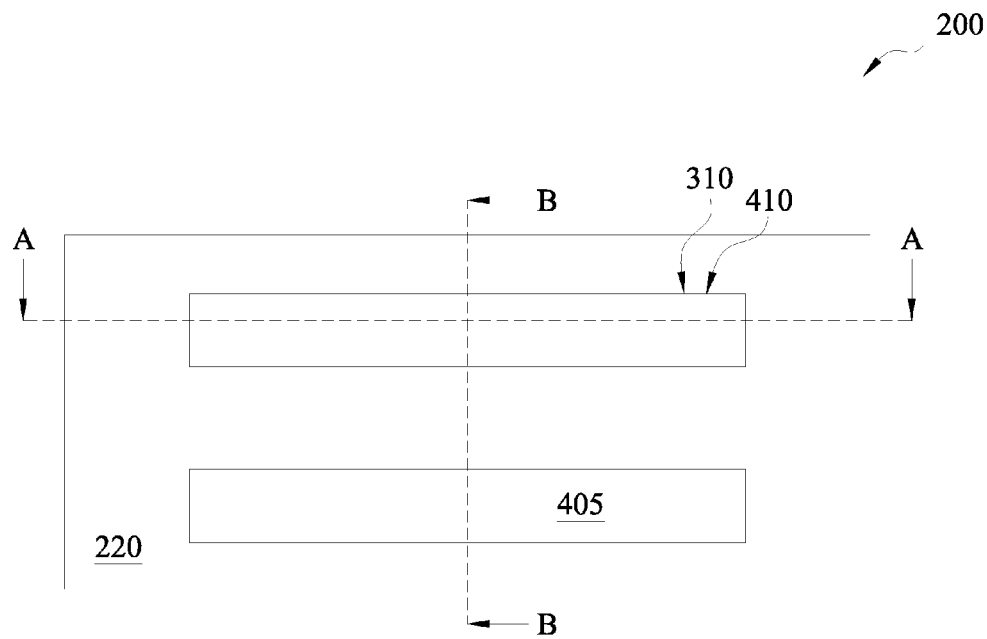
Figure 4D:
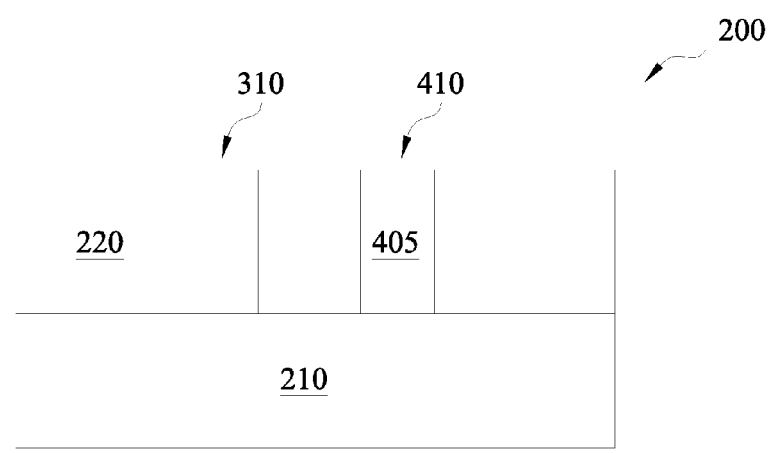
FIG. 4D is a cross-sectional view of an example semiconductor device in accordance with some embodiments, along the line B-B in FIG. 4C.

Thereafter, referring to FIGS. 4C-4D, a CMP process is performed to planarize the top surface of the device 200 to remove the excessive metal layer 405 over the first dielectric layer 220. The metal layer 405 in the first trenches 310 remains, forming the metal lines 410. As a result of the CMP process, the top surface of the dielectric layer 220 and the top surface of the metal lines 410 are substantially coplanar.

The metal lines 410 may be coupled to the active and/or passive devices in the substrate 210 through other underlying layers of an interconnect structure or through terminals (e.g., source, drain, and gate contacts) of the active and/or passive devices.

Figure 5A:
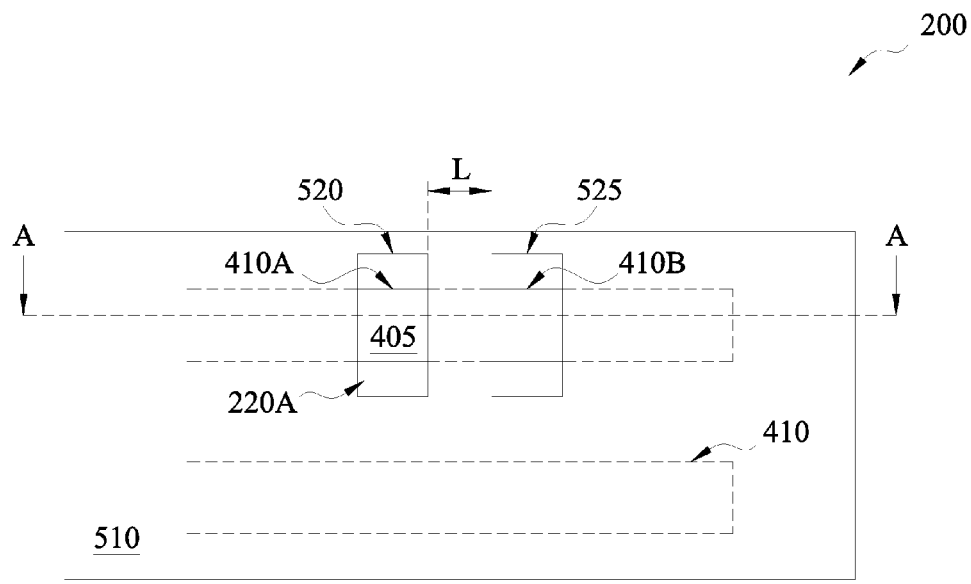
Figure 5B:
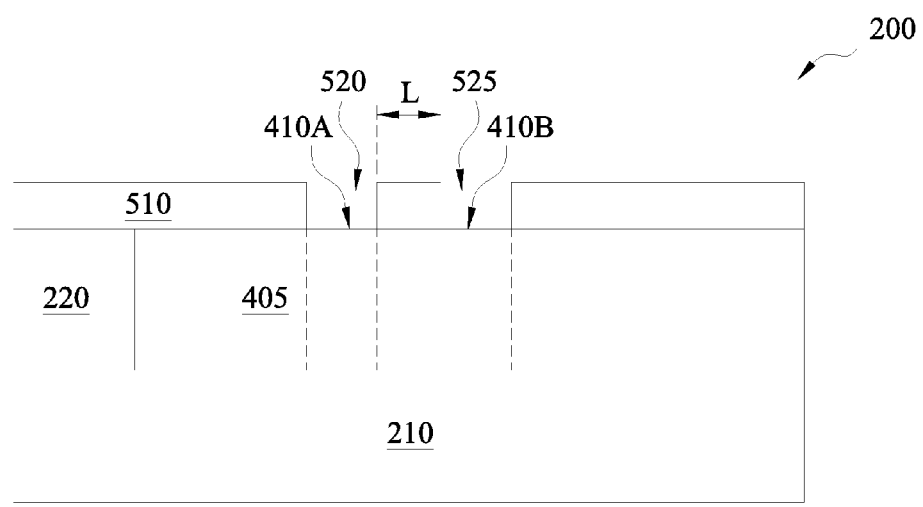
FIG. 5B is a cross-sectional view of an example semiconductor device in accordance with some embodiments, along the line A-A in FIG. 5A.

Referring to FIGS. 1 and 5A-5B, the method 100 proceeds to step 108 by forming a hard mask 510 (or cut hard mask) over the metal lines 410 and the dielectric layer 220. The hard mask 510 has a first opening 520 and a second opening 525 to expose a first portion and a second portion of the metal lines 410, now labeling them with the reference number 410A and 410B, respectively. In the present embodiment, the first opening 520 spaces from the second opening 525, along the line A-A direction, by a distance chosen to be a targeted length L of a future metal island, as described in detail below. In some embodiments, the hard mask 510 defines the first and second openings, 520 and 525, that are wider than the metal line 410 and a portion of the first dielectric layer 220 is also exposed in the first and second openings, 520 and 525, as identified by reference number 220A. In still other embodiments, the first and second openings, 520 and 525, have a larger width such that it extends to the adjacent first dielectric layer 220A to obtain advantages.

In some embodiments, the hard mask 510 is a patterned photoresist layer. In another embodiment, the hard mask 510 is formed by a procedure that includes depositing a hard mask layer, forming a patterned photoresist layer over the hard mask layer, and etching the hard mask layer using the patterned photoresist layer as an etch mask.

Figure 6A:
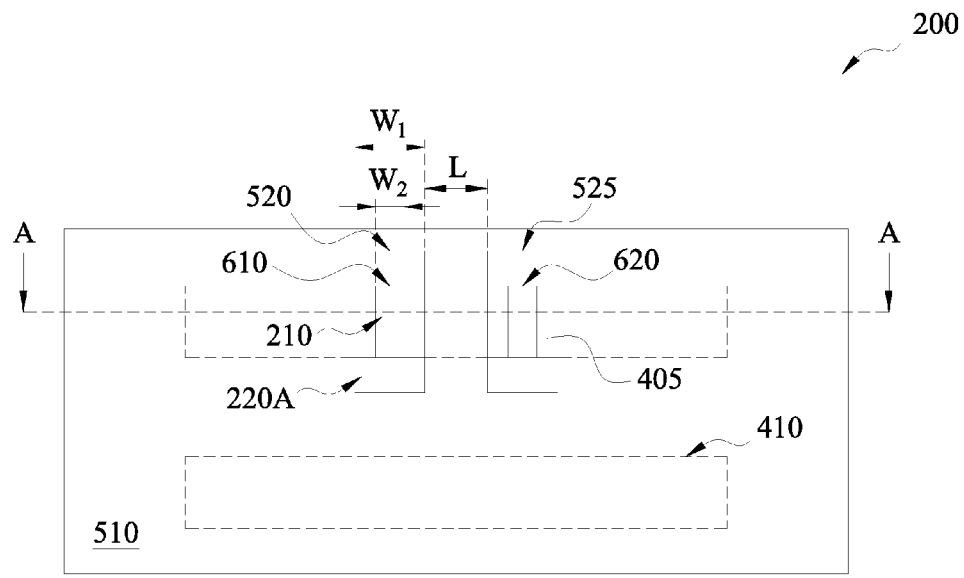
Figure 6B:
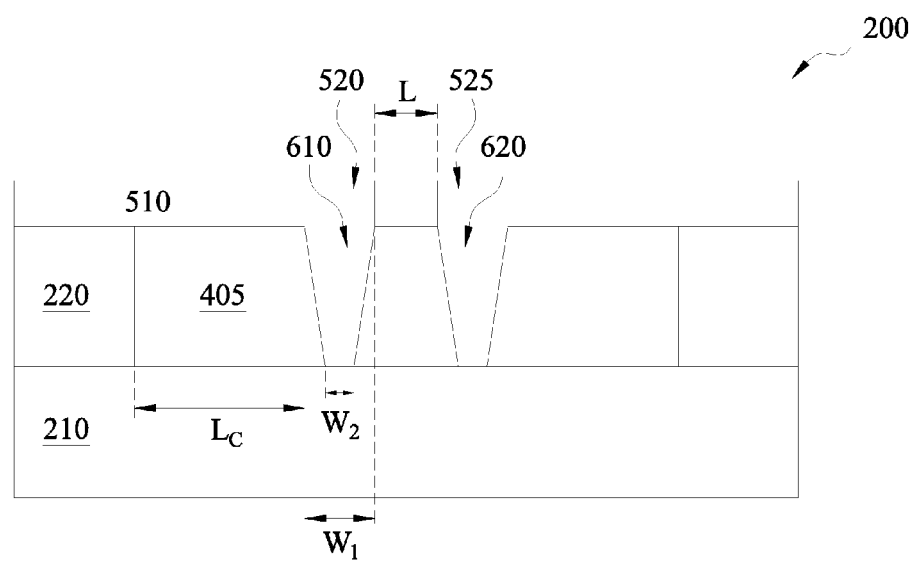
FIG. 6B is a cross-sectional view of an example semiconductor device in accordance with some embodiments, along the line A-A in FIG. 6A.

Referring to FIGS. 1 and 6A-6B, the method 100 proceeds to step 110 by removing exposed first portion and second portion of the metal line 410, 410A and 410B, through the first and second openings, 520 and 525, respectively, to form a second trench 610 and a third trench 620, respectively. A third portion of metal line 410, between the first and the second openings, 520 and 525, is protected by the hard mask 520 during the etch process. The etch process may include a wet etch, a dry etch, and/or a combination thereof. In some embodiments, the metal line 410 is a copper line and the copper etch gas applied in a reactive ion etching (RIE) includes CxHy, CxFy, CxHyFz, or combinations thereof. The subscript x, y or z has a value greater than 0 and less than 6. In some embodiments, the copper etch gas applied in a reactive ion etching (RIE) further includes at least one of CO and $O_2$, and at least one of $N_2$ and Ar. In furtherance of the present example, the etch temperature (substrate temperature) is within a range of about 20° C. and about 120° C. In another example, the etch temperature is within a range of about 20° C. and about 80° C.

In some embodiments, the second and third trenches, 610 and 620 are formed with a taper sidewall profile such that, along the line A-A direction, top openings of the second and third trenches, 610 and 620, have a first width $w_1$, which is larger than a second width $w_2$ of bottom openings of the second and third trenches, 610 and 620.

In some embodiments, a wet etch process may be alternatively or additionally used to remove the exposed first and second portions, 410A and 410B. The corresponding etchant may include mix of HCl, $FeCl_3$ and $H_2O$. In yet another embodiment, when the metal line 410 includes other suitable metal, such as aluminum or tungsten, other etch gas may be used.

In some embodiment, the metal lines 410 include a barrier layer surrounding the metal line 410A. In such a scenario, the etch process further includes etching the barrier layer. In one embodiment, the etch process to remove exposed metal line 410A includes a first etch sub-step to etch the metal layer 405 as described above and a second etch sub-step to etch the barrier layer, such as dry etch and/or wet etch. As an example, the second etch sub-step to etch the barrier layer includes a dry etch using a gas including CxFx, $N_2$ (or Ar), CxHy, and $Cl_2$ (or HBr). In another embodiment, a wet etch is used to etch the barrier layer and the corresponding etchant includes a standard clean solution (SC1) having $NH_4OH$, $H_2O_2$ and $H_2O$.

As discussed above in reference to FIGS. 5A-5B, in some embodiments, a portion of the dielectric layer 220A is exposed within the first and second openings, 520 and 525. In such a scenario, the etch process is properly chosen to etch the exposed first portion and second portion, 410A and 410B, without substantially etching the exposed dielectric layer 220A. In such an embodiment the exposed portion of the dielectric layer 220A within the first and second openings, 520 and 525, serve as sub-etch-masks during etching process. With the adequate etch selectivity, the exposed first portion and second portion, 410A and 410B, are removed with a self-alignment nature, which relaxes process constrains.

Figure 6C:
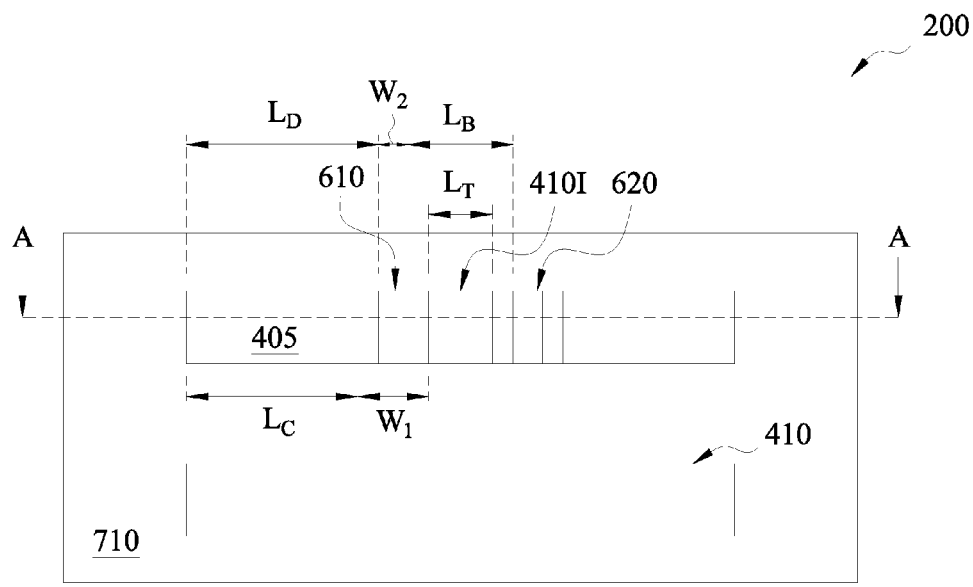
Figure 6D:
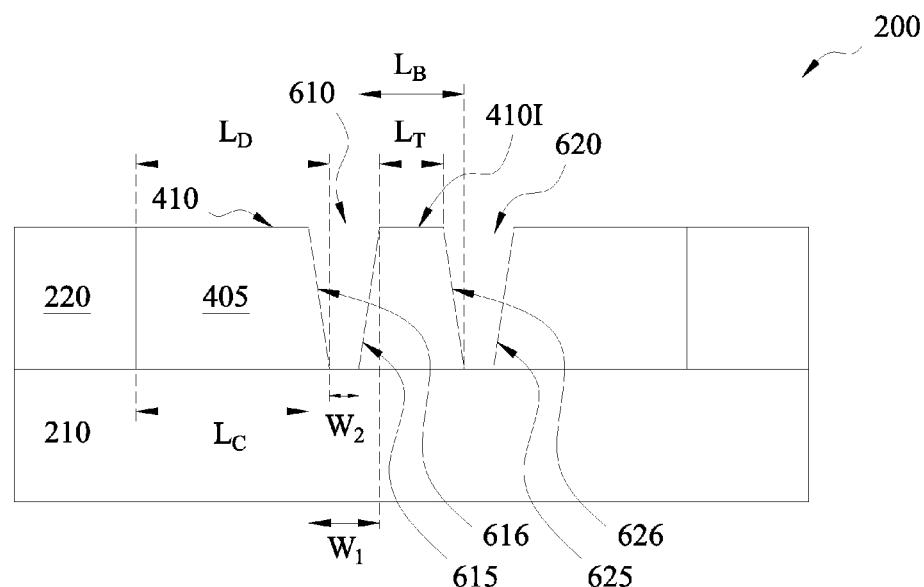
FIG. 6D is a cross-sectional view of an example semiconductor device in accordance with some embodiments, along the line A-A in FIG. 6C.

Referring to FIGS. 6C and 6D, after removing the exposed first and second portions, 410A and 410A, the hard mask 510 is removed by an etch process. In one example where the hard mask 510 is a photoresist pattern, the hard mask 510 is removed by wet stripping and/or plasma ashing. As shown, the metal line 410 is divided into several sub-metal lines including a metal island 410I, which is the third portion of the metal line 410 between the first and second openings, 520 and 525, as shown in FIGS. 5A and 5B. As shown, the first portion 410A of the metal line 410 defines a first sidewall 615 of the second trench 610, the metal island 410I defines a second sidewall 616 of the second trench 610 and a third sidewall 625 of the third trench 620 and the second portion 410B of the metal line 410 defines a fourth sidewall 626 of the third trench 620.

As discussed above in reference to FIGS. 5A-5B, in some embodiments, the second and third trenches, 610 and 620, have taper sidewall profiles. In such a scenario, the metal island 410I, along the line A-A direction, has a top length $L_T$, which is smaller than its bottom length $L_B$. At the meantime, each metal lines 410, next to each side of the metal island 410I, have t a bottom length $L_C$ is larger than its top length $L_D$, respectively.

In the present embodiment, instead of filling a metal layer into a small trench to form a metal island, the metal island 410I is formed by cutting the metal line 410. Such a method avoids gap filling issues, such as forming voids in the metal island 410I, or poor metal filling step coverage on sidewall and bottom of the trench.

Figure 7A:
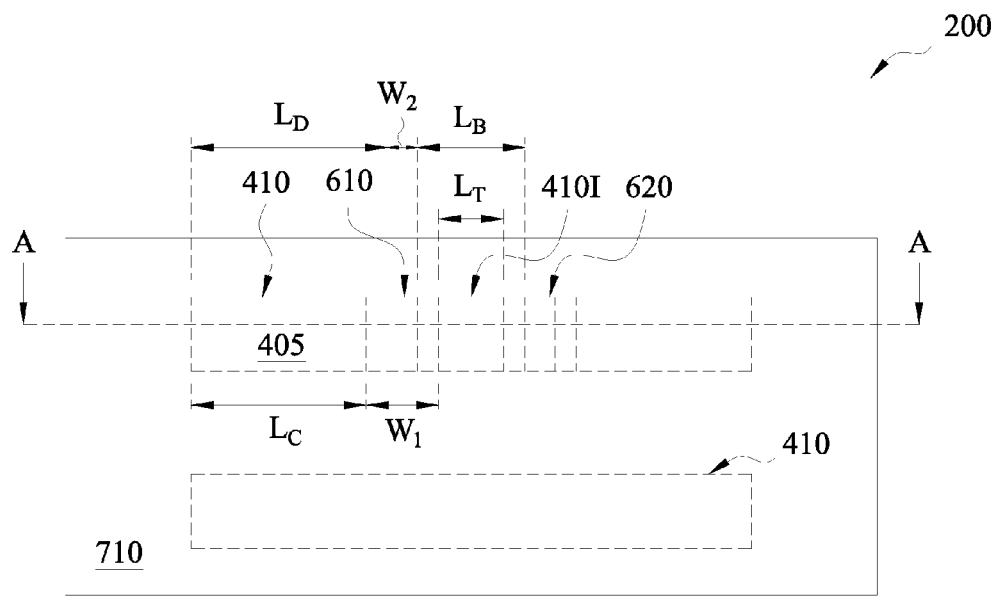
Figure 7B:
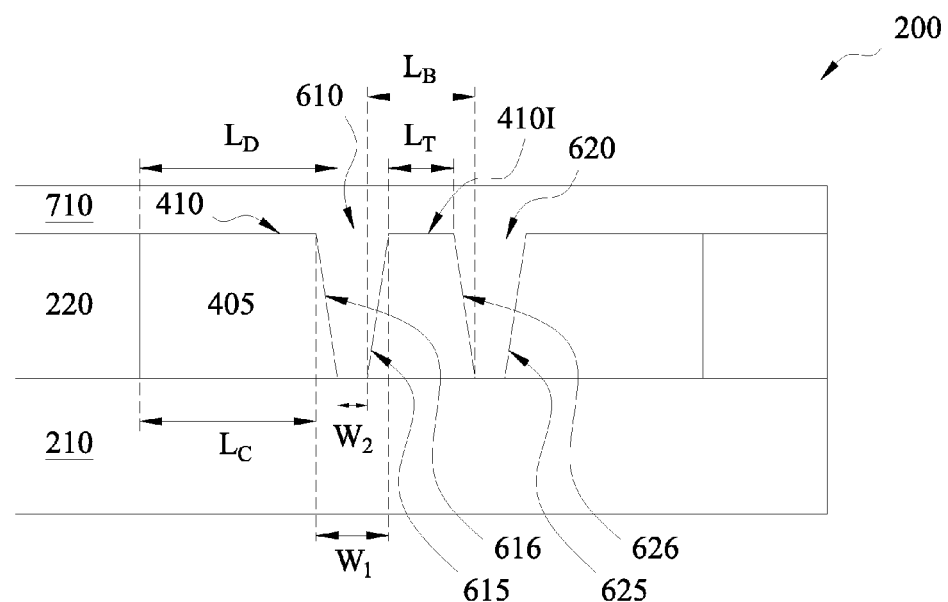
FIGS. 7B and 7C are cross-sectional views of an example semiconductor device in accordance with some embodiments, along the line A-A in FIG. 7A.

Referring to FIGS. 1 and 7A-7B, the method 100 proceeds to step 112 by depositing a second dielectric layer 710 over the first dielectric layer 220, the metal island 410I and the metal lines 410, including filling in the second and third trenches, 610 and 620, to provide electric isolation between the metal island 410I and the metal lines 410. The metal island 410I is embedded in the second dielectric layer 710. In one embodiment, the second dielectric material layer 710 is similar to the first dielectric material layer 220 in terms of composition. For example, the second dielectric 1 layer 710 includes a low-k dielectric material, silicon oxide, or other suitable dielectric material layer. The second dielectric layer 710 has a material with a lower dielectric constant (k) than the incumbent silicon dioxide to reduce the capacitance component as well as cross-talk between metal lines to minimize time delay and power dissipation. The second dielectric layer 710 may be deposited by CVD, ALD or spin-on coating.

As shown in FIGS. 7A-7B, the second dielectric layer 710 substantially fills the second and third trenches, 610 and 620. As an example, the second dielectric layer 710 is deposited by a spin-on dielectric (SOD) process to substantially fill in the second and third trenches, 610 and 620.

Figure 7C:
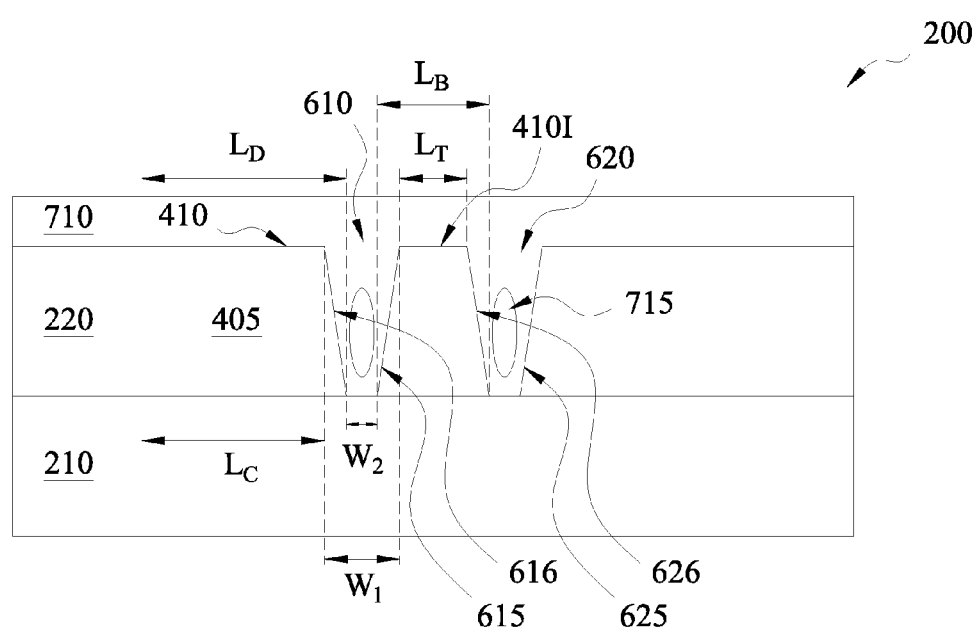

Alternatively, in another embodiment, the second dielectric layer 710 disposed in the second and third trenches, 610 and 620, includes voids (or air gaps) 715 to further reduce the average dielectric constant and increase the isolation efficiency, as shown in FIG. 7C. The air gaps 715 may be formed by choosing and tuning a proper deposition process to form the second dielectric layer 710. In one embodiment, the second dielectric layer 710 is deposited by CVD and the CVD deposition is tuned to form the air gaps 715. For example, when the CVD deposition rate is tuned to be higher such that the second dielectric layer 710 closes up before completely filling in the second and third trenches, 610 and 620, resulting in the air gaps 715.

In the present embodiment, the second dielectric layer 710 is deposited after the metal island 410I and the metal lines 410 are formed. This advantageously prevents the second dielectric layer 710 from experiencing plasma damage that could occur to the second dielectric 710 had it been present during the forming of metal layer 405 and the subsequent etching of metal lines 410. The plasma damage degrades low k value and causes poor capacitance performance of the circuit. The deposition of the second dielectric layer 710 also carries along with a self-form air-gap capability in the second trench 610 as discussed above with respect to FIG. 7C.

Additional steps can be provided before, during, and after the method 100, and some of the steps described can be replaced, eliminated, or moved around for additional embodiments of the method 100.

The semiconductor devices, 200, may include additional features, which may be formed by subsequent processing. For example, various vias/lines and multilayers interconnect features (e.g., metal layers and interlayer dielectrics) are formed over the substrate 210. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, it can be seen that the present disclosure provide methods of forming small metal island. The method employs cutting metal line to form a metal island to avoid small gap filling disadvantage. The method employs a scheme of forming metal lines, including metal islands, first and forming low-k dielectric layer last to minimize process-induced damage on a low-k dielectric layer.

The present disclosure provides many different embodiments of fabricating a semiconductor device that provide one or more improvements over existing approaches. In one embodiment, a method for fabricating a semiconductor device includes forming a first dielectric layer over a substrate, forming a first trench in the first dielectric layer, forming a metal line in the first trench, removing a first portion of the metal line to form a second trench and removing a second portion of the metal line to form a third trench. A third portion of the metal line is disposed between the second and third trenches. The method also includes forming a second dielectric layer in the second and third trenches.

In yet another embodiment, a method includes forming a first dielectric layer over a substrate, forming a metal line in the first dielectric layer, forming a patterned hard mask layer the metal line. The patterned hard mask layer has a first opening and a second opening that expose the metal line. The method also includes removing exposed portions of the metal line through the first and second openings to form first and second trenches, respectively, and forming a second dielectric layer in the first and second trenches.

In yet another embodiment, a semiconductor device includes a first metal line along a first direction disposed over a substrate and a second metal line aligning to the first metal line and along the first direction. Sidewalls of the second metal line, along the first direction, have a taper sidewall profile and a bottom side of the second metal line, along the first direction, is wider than a top side of the second metal line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first dielectric layer over a substrate;
   forming a first trench in the first dielectric layer;
   forming a metal line in the first trench;
   forming a hard mask layer over the metal line, the hard mask including first and second openings that expose a first portion and a second portion of the metal line, respectively, wherein a first portion of the first dielectric layer is exposed within the first opening;
   removing the first portion of the metal line to form a second trench and removing the second portion of the metal line to form a third trench, wherein a third portion of the metal line is disposed between the second and third trenches; and
   forming a second dielectric layer in the second and third trenches.

2. The method of claim 1, wherein the third portion of the metal line has a top width and a bottom width defined by the first trench and the second trench.

3. The method of claim 2, wherein the bottom width is greater than the top width.

4. The method of claim 1, wherein the forming of the second and third trenches includes removing the first portion and the second portion of the metal line to form a first sidewall and a second sidewall of the second trench and a third sidewall and a fourth sidewall of the third trench;
   wherein a top width and a bottom width of the second trench are defined by the first and second sidewalls, and a top width and a bottom width of the third trench are defined by the third and fourth sidewalls, and the top widths are greater than the bottom widths.

5. The method of claim 1, wherein the forming of the second and third trenches includes:
   forming a hard mask having two openings over the metal line; wherein the first portion and the second portion of the metal line are exposed in the two openings, respectively;
   etching two exposed portions of the metal line; and
   removing the hard mask.

6. The method of claim 1, wherein the forming of the second and third trenches includes using the first dielectric layer as a sub-etch-mask during removing the two exposed portions of the metal line.

7. The method of claim 1, wherein the forming a second dielectric layer in the second and third trenches includes forming air voids inside the second dielectric material layer.

8. The method of claim 1, wherein the forming the metal line includes forming a copper-containing metal line selected from a group consisting of copper (Cu), copper magnesium (CuMn), copper aluminum (CuAl), copper silicon (CuSi) and combinations thereof.

9. The method of claim 8, wherein the removing two portions of the metal line includes performing a plasma etching process with a gas containing at least one of CH, CF and CHF; one of CO and O2; and one of N2 and Ar.

10. A method comprising:
    forming a first trench in a first dielectric layer over a substrate;
    forming a metal line within the first trench;
    forming a patterned hard mask layer on the metal line, wherein the patterned hard mask layer has a first opening and a second opening to expose first and second portions of the metal line, respectively, wherein a first portion of the first dielectric layer is exposed within the first opening;
    etching the first and second portions of the metal line to form a metal island feature; and
    forming a second dielectric layer within the first and second openings.

11. The method of claim 10, wherein the etching the first and second portions of the metal line includes performing a plasma etching process with a gas containing at least one of CH, CF and CHF; one of CO and O2; and one of N2 and Ar.

12. The method of claim 10, wherein the forming of the metal island feature includes:
    etching the first portion of the metal line to form a first side wall of the metal island feature; and
    etching the second portion of the metal line to form a second sidewall of the metal island feature,
    wherein a top width and a bottom width of the metal island feature are defined by the first and second sidewalls.

13. The method of claim 12, wherein the bottom width of the metal island feature is greater than the top width of the metal island feature.

14. The method of claim 12, wherein the first sidewall of the metal island feature has a symmetrical slope with the second sidewall of the metal island feature.

15. The method of claim 10, wherein the forming of the metal line includes forming a copper-containing metal line selected from a group consisting of copper (Cu), copper magnesium (CuMn), copper aluminum (CuAl), copper silicon (CuSi) and combinations thereof.

16. The method of claim 10, wherein the forming of the second dielectric layer in the first and second openings includes forming air voids inside the second dielectric material layer.

17. A method comprising:
    forming a first dielectric over a substrate;
    forming a first trench in the first dielectric layer;
    forming a metal line within a first trench;
    forming a patterned hard mask layer over the metal line to expose a portion of the metal line and a portion of the first dielectric layer;
    etching the exposed portion of the metal line to form a cut trench; and
    forming a second dielectric layer within the cut trench.

18. The method of claim 17, wherein the forming of the cut trench includes etching the exposed portion of the metal line with a gas containing at least one of CH, CF and CHF; one of CO and O2; and one of N2 and Ar.

19. The method of claim 17, wherein the cut trench is longer than a width of the metal line.

20. The method of claim 17, wherein the forming of the second dielectric layer in the cut trench includes forming air voids inside the second dielectric material layer.

* * * * *